United States Patent [19]
Nakamura

[11] Patent Number: 5,838,166
[45] Date of Patent: Nov. 17, 1998

[54] COMPACT AND HIGH-SPEED JUDGING CIRCUIT USING MISFETS

[75] Inventor: Kazuyuki Nakamura, Tokyo, Japan

[73] Assignee: NEC Corporation, Tokyo, Japan

[21] Appl. No.: 657,768

[22] Filed: May 31, 1996

[51] Int. Cl.$^6$ .................................................. H03K 19/23
[52] U.S. Cl. .............................................. 326/36; 326/35
[58] Field of Search ................................. 326/11, 35, 36; 327/19, 20, 65, 66, 89

[56] References Cited

U.S. PATENT DOCUMENTS

| | | | |
|---|---|---|---|
| 3,365,584 | 1/1968 | Bragg | 326/35 |
| 4,825,104 | 4/1989 | Yamakoshi et al. | 327/65 |
| 4,912,745 | 3/1990 | Fitzpatrick et al. | 326/117 |
| 5,004,932 | 4/1991 | Nejime | 326/36 |
| 5,469,392 | 11/1995 | Ihara | 327/66 |

FOREIGN PATENT DOCUMENTS

| | | | |
|---|---|---|---|
| 53-91653 | 11/1978 | Japan | 326/35 |
| 61-482229 | 3/1986 | Japan | 326/35 |
| 61-242114 | 10/1986 | Japan | 326/35 |
| 62-142418 | 6/1987 | Japan | 326/35 |
| 1-27315 | 1/1989 | Japan | 326/35 |

*Primary Examiner*—Michael J. Tokar
*Assistant Examiner*—Richard Roseen
*Attorney, Agent, or Firm*—Sughrue, Mion, Zinn, Macpeak & Seas, PLLC

[57] ABSTRACT

To judge whether or not the number of high-level bits among N (N≦2) bits of an input signal is greater than a predetermined number M (1≦M<N), a judging circuit has a differential amplifier, N primary MISFETs, M secondary MISFETs, and primary and secondary resistors having the same resistance. Sources of the primary MISFETs are connected to the ground in common. Drains of the primary MISFETs are connected to one end of the primary resistor in common. The other end of the primary resistor is supplied with a power-supply voltage. Gates of the primary MISFETs are supplied with the N bits, respectively. The primary MISFETs have on-currents, respectively, which are equal to one another. An inverted input terminal of the amplifier is connected to the above-mentioned one end of the primary resistor. Sources of the secondary MISFETs are connected to the ground in common. Drains of the secondary MISFETs are connected to one end of the-secondary resistor in common. The other end of the secondary resistor is supplied with the power-supply voltage. Gates of the secondary MISFETs are supplied with a gate voltage in common so that the secondary MISFETs are constantly kept in an on-state. The secondary MISFETs have on-currents, respectively, equal to one another and equal to the on-currents of the primary MISFETs. A non-inverted input terminal of the amplifier is connected to the above-mentioned one end of the secondary resistor.

19 Claims, 11 Drawing Sheets

| JUDGEMENT | c0 | c1 | c2 | c3 |
|---|---|---|---|---|
| #"1" > 0 | 1 | 1 | 0 | 0 |
| #"1" > 1 | 1 | 0 | 0 | 0 |
| #"1" > 2 | 0 | 0 | 0 | 1 |
| #"1" > 3 | 0 | 0 | 1 | 1 | ness
COMPACT AND HIGH-SPEED JUDGING CIRCUIT USING MISFETS

BACKGROUND OF THE INVENTION

This invention relates to a judging circuit supplied with a digital input signal having a plurality of bits for judging whether or not the number of high-level bits having a high level among the plurality of bits exceeds a predetermined number (for example, a half of the total number of the plurality of bits).

For example, a majority judging circuit counts the number of high-level bits having a high level "1" among a plurality of bits included in a digital input signal and judges whether or not the number of the high-level bits is a majority of the bits included in the digital input signal. The majority judging circuit is used as a basic circuit to implement a system for decreasing I/O (input/output) noise and power dissipation on coding an interface signal.

Such a majority judging circuit is a key circuit for realizing low-power coding described in an article written by Jeff F. Tabor and entitled "Noise Reduction Using Low Weight and Constant Weight Coding Techniques", MIT Artificial Intelligence Laboratory Technical Report (AI-TR-1232), June 1990, pp. 42–55, and low-power coding described in an article written by M. R. Stan et al and entitled "Bus-Invert Coding for Low-Power I/O", IEEE Transactions on Very Large Scale Integration (VLSI) Systems, Vol 3, No. 1, March 1995, pp. 49–58. The majority judging circuit serves to control an encoding delay time.

The above-mentioned Stan et al article discloses a digital majority judging circuit and an analog majority judging circuit. However, both the digital majority judging circuit and the analog majority judgingcircuit are disadvantageous in a case where the digital input signal includes an increased number of bits. In order to deal with such an increased number of bits, the digital majority judging circuit inevitably has a large circuit scale and requires an increased number of logical stages which need an increased delay time, as will later be described in detail. On the other hand, in order to adapt the analog majority judging circuit to such an increased number of bits, judgment of a very small amount or value is required. Such delicate judgment is seriously affected by accuracy of circuit elements (for example, in resistance and in reference voltage) of the analog majority judging circuit, as will also later be described in detail.

SUMMARY OF THE INVENTION

It is therefore an object of this invention to provide a judging circuit which is hardly affected by accuracy of circuit elements, reduced in circuit scale, and operable at a high speed.

Other objects of this invention will become clear as the description proceeds.

A judging circuit to which this invention is applicable has a judgment result output terminal and is supplied with a digital input signal comprising first through N-th bits (N being an integer not smaller than two), each being any one of a high-level bit having a high level and a low-level bit having a low level. The judging circuit judges whether or not the number of the high-level bits among the first through the N-th bits is greater than a predetermined number M (M being an integer satisfying $1 \leq M < N$). The judging circuit thereby produces, when the number exceeds the predetermined number M, a judgment result which represents that the number exceeds the predetermined number M and which is delivered to the judgment result output terminal.

According to an aspect of this invention, the judging circuit comprises: a differential amplifier having an inverted-input terminal, a non-inverted input terminal, and an amplifier output terminal; first through N-th primary MISFETS, each having a source, a drain, and a gate; first through M-th secondary MISFETs, each having a source, a drain, and a gate; a primary resistor element; and a secondary resistor element having a resistance equal to that of the primary resistor element. The sources of the first through the N-th primary MISFETs are connected to the ground in common. The drains of the first through the N-th primary MISFETs are connected to one end of the primary resistor element in common. The other end of the primary resistor element is supplied with a power-supply voltage. The gates of the first through the N-th primary MISFETs are supplied with the first through the N-th bits, respectively. The first through the N-th primary MISFETs have on-currents, respectively, which are equal to one another, the inverted input terminal of the differential amplifier being connected to the above-mentioned one end of the primary resistor element. The sources of the first through the M-th secondary MISFETs are connected to the ground in common. The drains of the first through the M-th secondary MISFETs are connected to one end of the secondary resistor element in common. The other end of the secondary resistor element is supplied with the power-supply voltage. The gates of the first through the M-th secondary MISFETs are supplied with a gate voltage in common so that the first through the M-th secondary MISFETs are constantly kept in an on-state. The first through the M-th secondary MISFETs have on-currents, respectively, which are equal to one another and equal to the on-currents of the first through the N-th primary MISFETs. The non-inverted input terminal of the differential amplifier is connected to the above-mentioned one end of the secondary resistor element. The amplifier output terminal is connected to the judgment result output terminal.

According to another aspect of this invention, the judging circuit comprises: a differential amplifier having an inverted input terminal, a non-inverted input terminal, and an amplifier output terminal; first through N-th primary MISFETs, each having a source, a drain, and a gate; first through N-th secondary MISFETs, each having a source, a drain, and a gate; a primary resistor element; and a secondary resistor element having a resistance equal to that of the primary resistor element. The sources of the first through the N-th primary MISFETs are connected to the ground in common. The drains of the first through the N-th primary MISFETs are connected to one end of the primary resistor element in common. The other end of the primary resistor element is supplied with a power-supply voltage. The gates of the first through the N-th primary MISFETs are supplied with the first through the N-th bits, respectively. The first through the N-th primary MISFETs have on-currents, respectively, which are equal to one another. The inverted input terminal of the differential amplifier is connected to the above-mentioned one end of the primary resistor element. The sources of the first through the N-th secondary MISFETs are connected to the ground in common. The drains of the first through the N-th secondary MISFETs are connected to one end of the secondary resistor element in common. The other end of the secondary resistor element is supplied with the power-supply voltage. The first through the N-th secondary MISFETs have on-currents, respectively, which are equal to one another and equal to the on-currents of the first through the N-th primary MISFETs. The non-inverted input terminal of the differential amplifier is connected to the above-mentioned one end of the secondary resistor element. The gates of a preselected number of secondary MISFETs of the first through the N-th secondary MISFETs are supplied with a gate voltage in common so that the preselected number of secondary MISFETs are constantly kept in an on-state. The preselected number is equal to the predetermined number M. The amplifier output terminal is connected to the judgment result output terminal.

According to still another aspect of this invention, the judging circuit comprises: first, second, and third amplifier MISFETs, each having a source, a drain, and a gate; first through N-th primary MISFETs, each having a source, a drain, and a gate; first through M-th secondary MISFETs, each having a source, a drain, and a gate. Each of the third amplifier MISFET, the first through the N-th primary MISFETs, and the first through the M-th secondary MISFETs is an MISFET of a first conductivity-channel type. Each of the first and the second amplifier MISFETs is another MISFET of a second conductivity-channel type which is different from the first conductivity-channel type. The sources of the first and the second amplifier MISFETs are supplied with a power-supply voltage in common. The gates of the first and the second amplifier MISFETs are connected to the drain of the first amplifier MISFET in common. The source of the third amplifier MISFET is connected to the ground. The gate of the third amplifier MISFET is supplied with a gate voltage so that the third amplifier MISFET is constantly kept in an on-state. The sources of the first through the N-th primary MISFETs are connected to the drain of the third amplifier MISFET in common. The drains of the first through the N-th primary MISFETs are connected to the drain of the first amplifier MISFET in common. The gates of the first through the N-th primary MISFETs are supplied with the first through the N-th bits, respectively. The first through the N-th primary MISFETs have on-currents, respectively, which are equal to one another. The sources of the first through the M-th secondary MISFETs are connected to the drain of the third amplifier MISFET in common. The drains of the first through the M-th secondary MISFETs are connected to the drain of the second amplifier MISFET in common. The gates of the first through the M-th secondary MISFETs are supplied with another gate voltage so that the first through the M-th secondary MISFETs are constantly kept in an on-state. The first through the M-th secondary MISFETs have on-currents, respectively, which are equal to one another and equal to the on-currents of the first through the N-th primary MISFETs. The drain of the second amplifier MISFET is connected to the judgment result output terminal.

Another judging circuit to which this invention is applicable has a judgment result output terminal and which is supplied with a digital input signal comprising first through N-th bits (N being an integer not smaller than two), each being any one of a high-level bit having a high level and a low-level bit having a low level. The judging circuit judges whether or not the number of the high-level bits among the first through the N-th bits is a majority of the first through the N-th bits. The judging circuit thereby produces, when the number is the majority, a judgment result which represents that the number is the majority and which is delivered to the judgment result output terminal.

In this case, according to an aspect of this invention, the judging circuit comprises: first through N-th inverters for inverting the first through the N-th bits into first through N-th inverted bits; a differential amplifier having an inverted input terminal, a non-inverted input terminal, and an amplifier output terminal; first through N-th primary MISFETS, each having a source, a drain, and a gate; first through N-th secondary MISFETs, each having a source, a drain, and a gate; a primary resistor element; and a secondary resistor element having a resistance equal to that of the primary resistor element. The sources of the first through the N-th primary MISFETs are connected to the ground in common. The drains of the first through the N-th primary MISFETs are connected to one end of the primary resistor element in common. The other end of the primary resistor element is supplied with a power-supply voltage. The gates of the first through the N-th primary MISFETs are supplied with the first through the N-th bits, respectively. The first through the N-th primary MISFETs have on-currents, respectively, which are equal to one another. The inverted input terminal of the differential amplifier is connected to the above-mentioned one end of the primary resistor element. The sources of the first through the N-th secondary MISFETs are connected to the ground in common. The drains of the first through the N-th secondary MISFETs are connected to one end of the secondary resistor element in common. The other end of the secondary resistor element is supplied with the power-supply voltage. The gates of the first through the N-th secondary MISFETs are supplied with the first through the N-th inverted bits, respectively. The first through the N-th secondary MISFETs have on-currents, respectively, which are equal to one another and equal to the on-currents of the first through the N-th primary-MISFETs. The non-inverted input terminal of the differential amplifier is connected to the above-mentioned one end of the secondary resistor element. The amplifier output terminal is connected to the judgment result output terminal.

According to another aspect of this invention, the judging circuit comprises: first through N-th inverters for inverting the first through the N-th bits into first through N-th inverted bits; first, second, and third amplifier MISFETs, each having a source, a drain, and a gate; first through N-th primary MISFETs, each having a source, a drain, and a gate; first through N-th secondary MISFETs, each having a source, a drain, and a gate. Each of the third amplifier MISFET, the first through the N-th primary MISFETS, and the first through the N-th secondary MISFETS is an MISFET of a first conductivity-channel type. Each of the first and the second amplifier MISFETs is another MISFET of a second conductivity-channel type which is different from the first conductivity-channel type. The sources of the first and the second amplifier MISFETs are supplied with a power-supply voltage in common. The gates of the first and the second amplifier MISFETs are connected to the drain of the first amplifier MISFET in common. The source of the third amplifier MISFET is connected to the ground. The gate of the third amplifier MISFET is supplied with a gate voltage so that the third amplifier MISFET is constantly kept in an on-state. The sources of the first through the N-th primary MISFETs are connected to the drain of the third amplifier MISFET in common. The drains of the first through the N-th primary MISFETs are connected to the drain of the first amplifier MISFET in common. The gates of the first through the N-th primary MISFETs are supplied with the first through the N-th bits, respectively. The first through the N-th primary MISFETs have on-currents, respectively, which are equal to one another. The sources of the first through the N-th secondary MISFETs are connected to the drain of the third amplifier MISFET in common. The drains of the first through the N-th secondary MISFETs are connected to the drain of the second amplifier MISFET in common. The gates of the first through the N-th secondary MISFETs are supplied with the first through the N-th inverted bits, respectively. The first through the N-th secondary MISFETs have on-currents, respectively, which are equal to one another and equal to the on-currents of the first through the N-th primary MISFETS. The drain of the second amplifier MISFET are connected to the judgment result output terminal.

DESCRIPTION OF THE PREFERRED EMBODIMENTS

Figure 1:
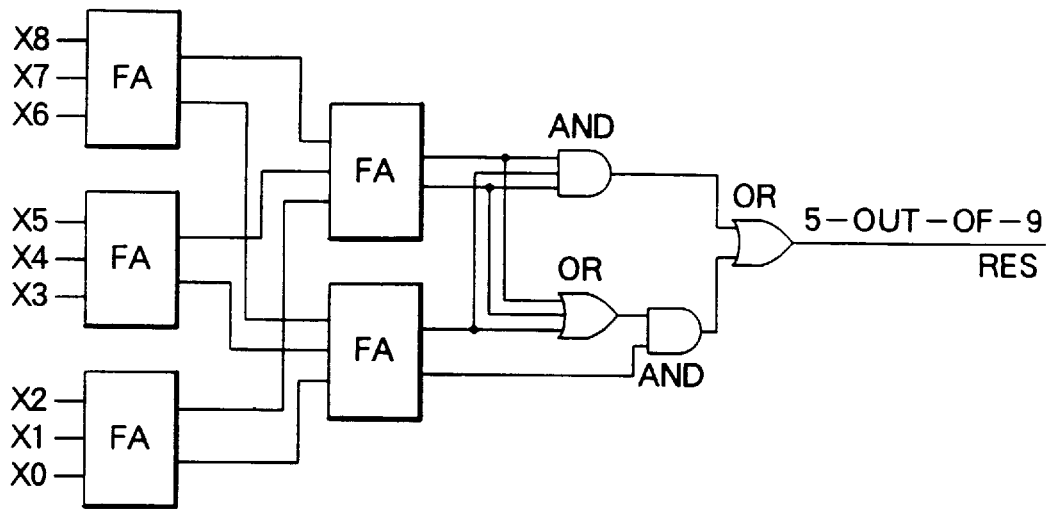
FIG. 1 is a block diagram of a conventional judging circuit.
Figure 2:
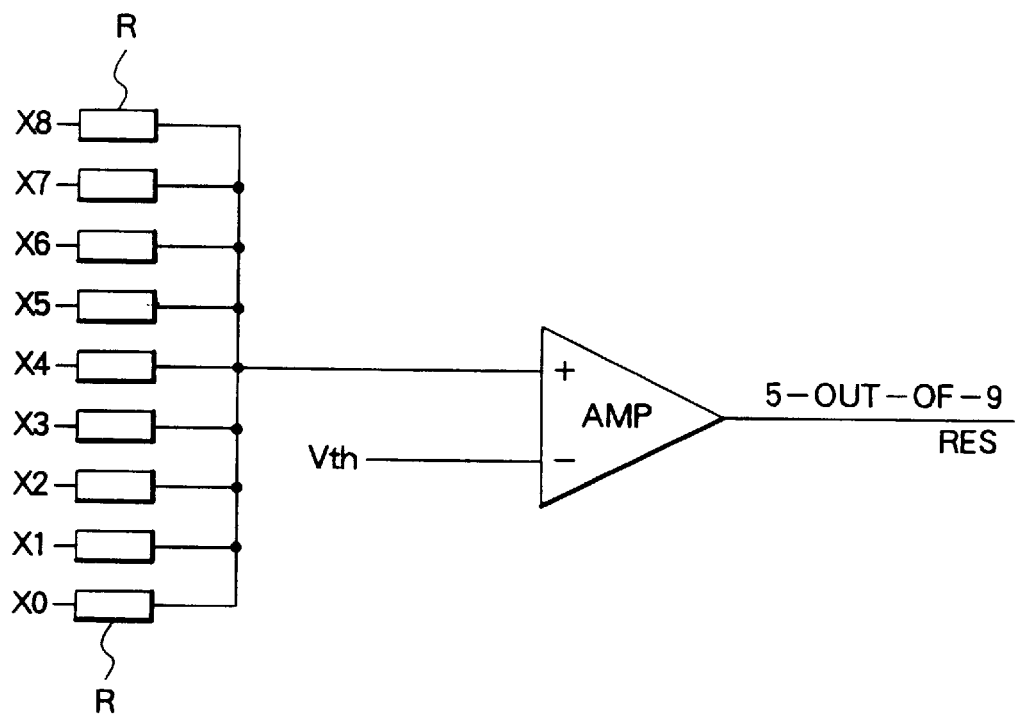
FIG. 2 is a block diagram of another conventional judging circuit.

Referring to FIGS. 1 and 2, two conventional majority judging circuits will first be described for a better understanding of this invention.

In FIG. 1, a digital majority judging circuit is illustrated which is disclosed in the above-mentioned Stan et al article. The digital majority judging circuit is implemented by a combination of one-bit full adders (FA), five in number, AND circuits, two in number, and OR circuits, two in number. The judging circuit illustrated in FIG. 1 is supplied with a digital input signal including nine bits X0 through X8 and carries out judgment (5-out-of-9 judgment) whether or not at least five bits of the nine bits have a high level "1". In the judging circuit, signal values of the nine bits are summed up by the full adders to obtain a resultant sum. A digital logic circuit formed by a combination of the AND circuits and the OR circuits judges whether or not the resultant sum is equal to or greater than five. The result of the judgment is delivered to a judgment result output terminal RES. Since the signal values are processed in a digital fashion, this judging circuit is resistant to noise and is hardly affected by accuracy of the circuit elements. That is, it is not necessary with the judging circuit to use the circuit elements having high accuracy. However, as described in the foregoing, the increase in number of the bits included in the digital input signal inevitably requires a large circuit scale and an increased number of logical steps which need an increased delay time.

In FIG. 2, an analog majority judging circuit is illustrated which is also disclosed in the above-mentioned Stan et al article. The analog majority judging circuit comprises nine resistor elements R and a differential amplifier (operational amplifiex) AMP. The resistor elements R are driven by nine bits X0 through X8 included in the digital input signal to produce a sum voltage which is supplied to a non-inverted input terminal of the differential amplifier AMP. On the other hand, a predetermined threshold voltage Vth is supplied as a reference voltage to an inverted input terminal of the differential amplifier AMP. The sum voltage is compared with the predetermined threshold voltage Vth to carry out majority judgment (5-out-of-9 judgment). As described in the foregoing, the analog majority judging circuit is seriously affected by accuracy of the threshold voltage Vth and accuracy of the resistor elements R. In other words, it is necessary with the judging circuit to use the circuit elements having high accuracy.

Figure 3:
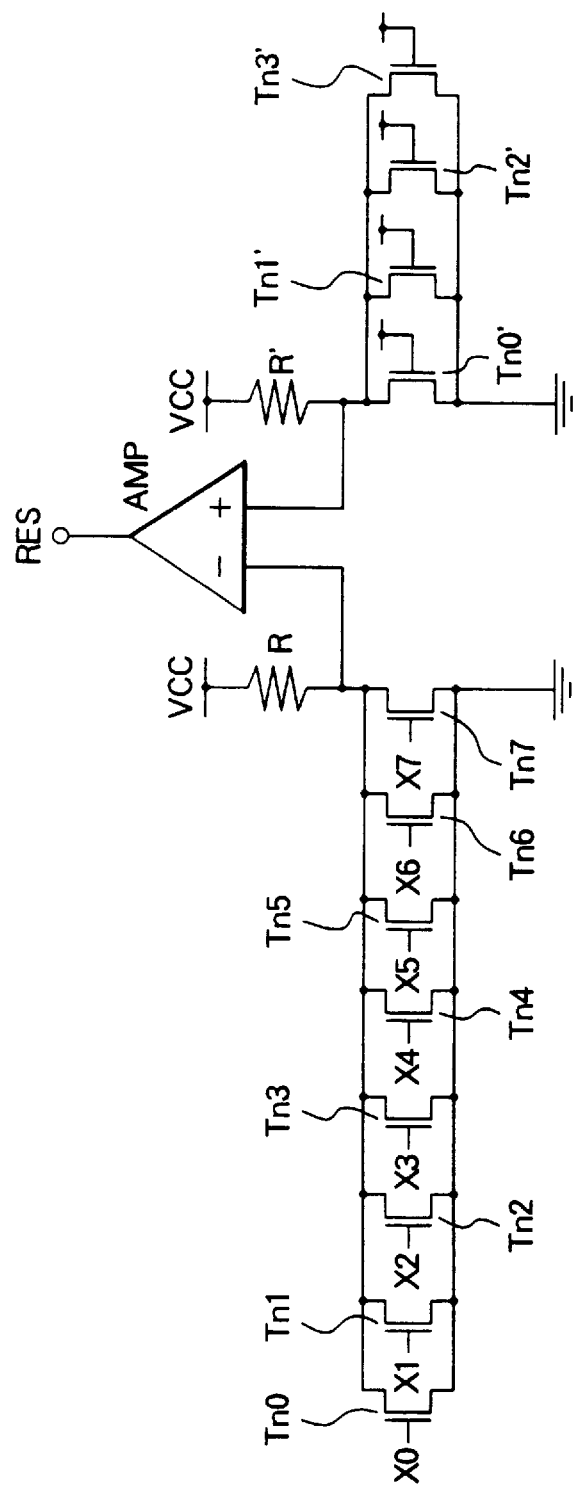
FIG. 3 is a block diagram of a judging circuit according to a first embodiment of this invention.

Referring to FIG. 3, a judging circuit according to a first embodiment of this invention has a judgment result output terminal RES. The judging circuit is supplied with a digital input signal including first through N-th bits (N being an integer not smaller than two), each of which is either a high-level bit having a high level "1" or a low-level bit having a low level "0". The judging circuit judges whether or not the number of the high-level bits among the first through the N-th bits is greater than a predetermined number M (M being an integer satisfying $1 \leq M < N$). The judging circuit thereby produces, when the judging circuit judges that the number of the high-level bits exceeds the predetermined number M, a judgment result which represents that the number of the high-level bits exceeds the predetermined number M. The judgment result is delivered to the judgment result output terminal RES.

In the illustrated judging circuit, N and M are equal to eight and four, respectively. Specifically, the illustrated judging circuit is supplied with the digital input signal including first through eighth bits X0 through X7. The illustrated judging circuit judges whether or not the number of the high-level bits is greater than four. When the judging circuit judges that the number of the high-level bits is greater than four, the judging circuit produces the judgment result which represents that the number of the high-level bits is greater than four and which is delivered to the judgment result output terminal RES. In this event, the illustrated judging circuit produces, as the judgment result, a judgment result signal having a high level "1" when the number of the high-level bits is not smaller than five (that is, when the number of the high-level bits is a majority of the first through the eighth bits X0 through X7).

The judging circuit comprises a differential amplifier (operational amplifier) AMP having an inverted input terminal (−), a non-inverted input terminal (+), and an amplifier output terminal, first through eighth primary MISFETs (metal insulator semiconductor field effect transistors) Tn0 to Tn7, each having a source, a drain, and a gate, first through fourth secondary MISFETs Tn0' to Tn3', each having a source, a drain, and a gate, a primary resistor element R, and a secondary resistor element R' having a resistance equal to that of the primary resistor element R.

Each of the first through the eighth primary MISFETs Tn0 to Tn7 and the first through the fourth. secondary MISFETs Tn0' to Tn3' is an n-channel MISFET.

The sources of the first through the eighth primary MISFETs Tn0 to Tn7 are connected to the ground in common. The drains of the first through the eighth primary MISFETs Tn0 to Tn7 are connected to one end of the primary resistor element R in common. The other end of the primary resistor element R is supplied with a power-supply voltage VCC. The gates of the first through the eighth primary MISFETs Tn0 to Tn7 are supplied with the first through the eighth bits X0 through X7, respectively. When the first through the eighth primary MISFETs Tn0 to Tn7 are put in an on-state (or conductive state), the first through the eighth primary MISFETs Tn0 to Tn7 have on-currents, respectively, which are equal to one another. For this purpose, the first through the eighth primary MISFETs Tn0 to Tn7 is equal in transistor size (more particularly, in gate length and in gate width). The inverted input terminal (−) of the differential amplifier AMR is connected to the above-mentioned one end of the primary resistor element R.

The sources of the first through the fourth secondary MISFETs Tn0' to Tn3' are connected to the ground in common. The drains of the first through the fourth secondary MISFETs Tn0' to Tn3' are connected to one end of the secondary resistor element R' in common. The other end of the secondary resistor element R' is supplied with the power-supply voltage VCC. The gates of the first through the fourth secondary MISFETs Tn0' to Tn3' are supplied with a gate voltage in common so that the first through the fourth secondary MISFETS Tn0' to Tn3' are constantly kept in an on-state. The first through the fourth secondary MISFETs Tn0' to Tn3' have on-currents, respectively, which are equal to one another and equal to the on-currents of the first through the eighth primary MISFETs Tn0 to Tn7. That is, each of the first through the fourth secondary MISFETs Tn0' to Tn3' is equal in transistor size to the first through the eighth primary MISFETs Tn0 to Tn7. The non-inverted input terminal (+) of the differential amplifier AMP is connected to the above-mentioned one end of the secondary resistor element R'.

The amplifier output terminal of the differential amplifier AMP is connected to the judgment result output terminal RES.

In the judging circuit illustrated in FIG. 3, the first through the eighth bits X0 through X7 of the digital input signal are supplied to the gates of the first through the eighth primary MISFETs Tn0 to Tn7, respectively. As a result, the primary MISFETs supplied with the high-level bits are rendered into a conductive state or an on-state. As a consequence, a current flows through the primary resistor element R to produce a signal voltage on the inverted input terminal (−) of the differential amplifier AMP.

A combination of the first through the eighth primary MISFETs Tn0 to Tn7 and the primary resistor element R constitutes an analog sum producing arrangement.

On the other hand, in order to produce a reference voltage level for majority judgment on the input digital signal of the eight bits, the first through the fourth secondary MISFETs Tn0' to Tn3' are rendered in the conductive state or the on-state to thereby make a current flow through the secondary resistor element R'. As a consequence, the reference voltage level is applied to the non-inverted input terminal (+) of the differential amplifier AMP.

A combination of the first through the fourth secondary MISFETs Tn0' to Tn3' and the secondary resistor element R' constitutes a reference voltage producing arrangement.

The differential amplifier AMP compares the signal voltage of the inverted input terminal (−) and the reference voltage level of the non-inverted input terminal (+) to judge whether or not the number of the high level "1" is a majority of the first through the eighth bits X0 through X7. In this judging circuit, when the digital input signal includes at least five high-level bits, the judgment result signal having a high level "1" appears in the judgment result output terminal RES. Even If the number of bits included in the digital input signal is increased, it is readily possible to adapt the judging circuit thereto by simply increasing the number of the MISFETs. Since the reference voltage level is produced by the reference voltage producing arrangement comprising the similar circuit elements, the judging circuit is hardly affected by accuracy of the circuit elements.

Thus, the judging circuit is hardly affected by accuracy of the circuit elements because the reference voltage producing arrangement comprises the similar circuit elements and the similar circuit structure to those of the analog sum producing arrangement. In addition, the judging circuit is excellent in precision of judgment because an input signal has a digital value, and compact in scale because the number of the circuit elements is small. As described above, the judging circuit is advantageous as compared with the above-mentioned conventional judging circuits.

Figure 4:
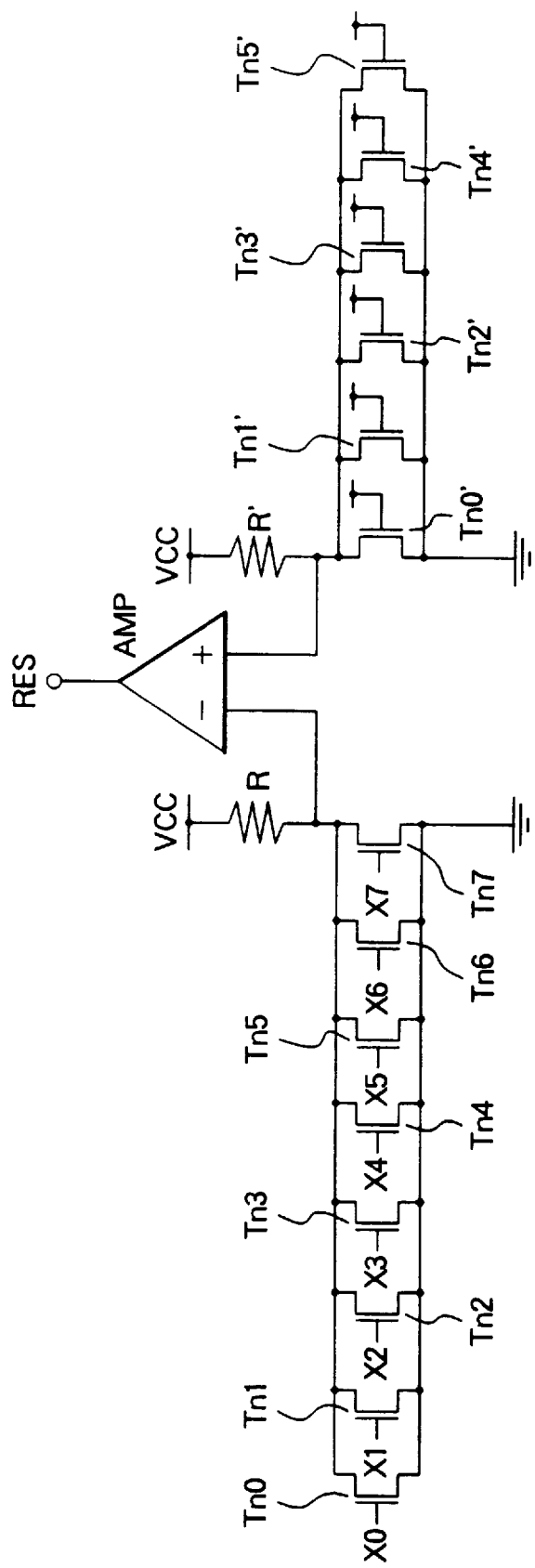
FIG. 4 is a block diagram of a judging circuit according to a second embodiment of this invention.

Turning to FIG. 4, a judging circuit according to a second embodiment of this intention is similar to the judging circuit of FIG. 3 except that M is equal to six. That is, the judging circuit illustrated in, FIG. 4 judges whether or not the number of the high-level bits among the first through the eighth bits X0 through X7 is greater than six. When the judging circuit judges that the number of the high-level bits is greater than six, the judging circuit produces the judgment result which represents that the number of the high-level bits is greater than six and which is delivered to the judgment result output terminal RES. In this event, the illustrated judging circuit produces, as the judgment result, a judgment result signal having a high level "1" when the number of the high-level bits is not smaller than seven.

For this purpose, the judging circuit of FIG. 4 has first through sixth secondary MISFETs Tn0' to Tn5', each having a source, a drain, and a gate. Each of the first through the sixth secondary MISFETs Tn0' to Tn5' is an n-channel MISFET like the first through the eighth primary MISFETs Tn0 to Tn7.

The sources of the first through the sixth secondary MISFETs Tn0' to Tn5' are connected to the ground in common. The drains of the first through the sixth secondary MISFETs Tn0' to Tn5' are connected to one end of the secondary resistor element R' in common. The other end of the secondary resistor element R' is supplied with the power-supply voltage VCC. The gates of the first through the sixth secondary MISFETs Tn0' to Tn5' are supplied with a gate voltage in common so that the first through the sixth secondary MISFETs Tn0' to Tn5' are constantly kept in an on-state. The first through the sixth secondary MISFETs Tn0' to Tn5' have on-currents, respectively, which are equal to one another and equal to the on-currents of the first through the eighth primary MISFETs Tn0 to Tn7. The non-inverted input terminal (+) of the differential amplifier AMP is connected to the above-mentioned one end of the secondary resistor element R'.

Figure 5:
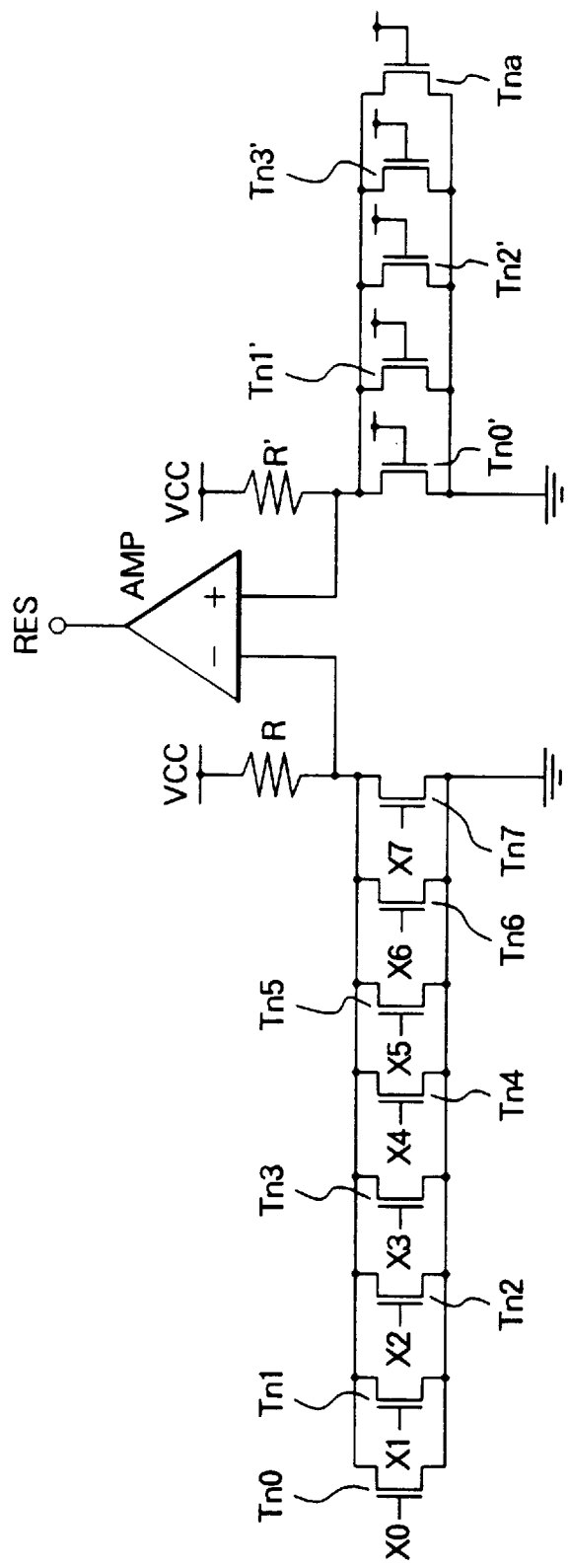
FIG. 5 is a block diagram of a judging circuit according to a third embodiment of this invention.

Turning to FIG. 5, a judging circuit according to a third embodiment of this invention is similar to the judging circuit of FIG. 3 except that the judging circuit of FIG. 5 further has an additional MISFET Tna having a source, a drain, and a gate. The additional MISFET Tna is an n-channel MISFET like the first through the eighth primary MISFETs Tn0 to Tn7 and the first through the fourth secondary MISFETs Tn0' to Tn3'.

The source of the additional MISFET Tna is connected to the ground. The drain of the additional MISFET Tna is connected to the above-mentioned one end of the secondary resistor element R'. The gate of the additional MISFET Tna is supplied with another gate voltage so that the additional MISFET Tna is constantly kept in an on-state. The additional MISFET Tna has an on-current smaller than the on-current of each of the first through the fourth secondary MISFETs Tn0' to Tn3'. To this end, the additional MISFET Tna has a transistor size smaller than that of each of the first through the fourth secondary MISFETs Tn0' to Tn3'. Preferably, the additional MISFET Tna has an on-current which is a half of the on-current of each of the first through the fourth secondary MISFETs Tn0' to Tn3'.

When the number of the high level bits among the first through the eighth bits X0 to X7 is equal to four which is equal to the number of the secondary MISFETs Tn0' to Tn3', the judging circuit of FIG. 3 may produce a judgment result signal having an intermediate level lower than the high level "1" and higher than a low level "0" to thereby deliver the judgment result signal having the intermediate level to the judgment result output terminal RES. In order to prevent the judgment result output terminal RES from being supplied with the intermediate level, the additional MISFET Tna of a small size in added to the judging circuit in FIG. 5. As a result, the judging circuit of FIG. 5 produces a judgment result signal having the low level "0" on the judgment result output terminal RES when the number of the high level bits among the first through the eighth bits X0 to X7 is equal to four.

The drain of the additional MISFET Tna may be connected to the above-mentioned one end of the primary resistor element R without connecting the gate of the additional MISFET Tna to the above-mentioned one end of the secondary resistor element R'. In this case, the high level "1" is produced not only when the number of the high level bits among the first through the eighth bits X0 to X7 is greater than four but also when the number of the high level bits among the first through the eighth bits X0 to X7 is equal to four.

Figure 6:
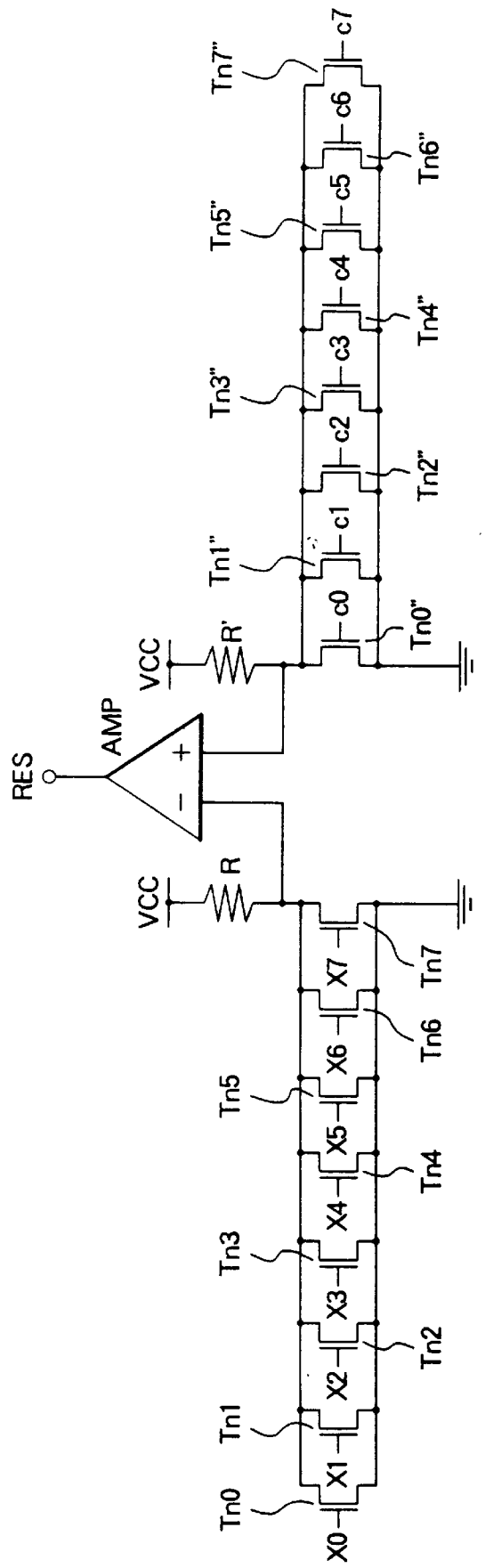
FIG. 6 is a block diagram of a judging circuit according to a fourth embodiment of this invention.

Turning to FIG. 6, a judging circuit according to a fourth embodiment of this invention is similar to the judging circuit of FIG. 3 except for the following. The judging circuit of FIG. 6 is provided with first through eighth (N-th) secondary MISFETs (n-channel MISFETs) Tn0" to Tn7" instead of the first through the fourth (M-th) secondary MISFETs Tn0' to Tn3' of FIG. 3.

The sources of the first through the eighth (N-th) secondary MISFETs Tn0" to Tn7" are connected to the ground in common. The drains of the first through the eighth (N-th) secondary MISFETs Tn0" to Tn7" are connected to the above-mentioned one end of the secondary resistor element R' in common. The first through the eighth (N-th) secondary MISFETs Tn0" to Tn7" having on-currents, respectively, which are equal to one another and equal to the on-currents of the first through the eighth (N-th) primary MISFETs Tn0 to Tn7.

The gates of a preselected number of secondary MISFETs of the first through the eighth (N-th) secondary MISFETs Tn0" to Tn7" are supplied with a gate voltage in common so that the preselected number of secondary MISFETs are constantly kept in an on-state. The preselected number is equal to the predetermined number M which is equal to four.

The judging circuit thereby produces a high level "1" as the judgment result when the number of the high level bits among the first through the eighth bits X0 to X7 exceeds the predetermined number M (=four).

Figure 7:
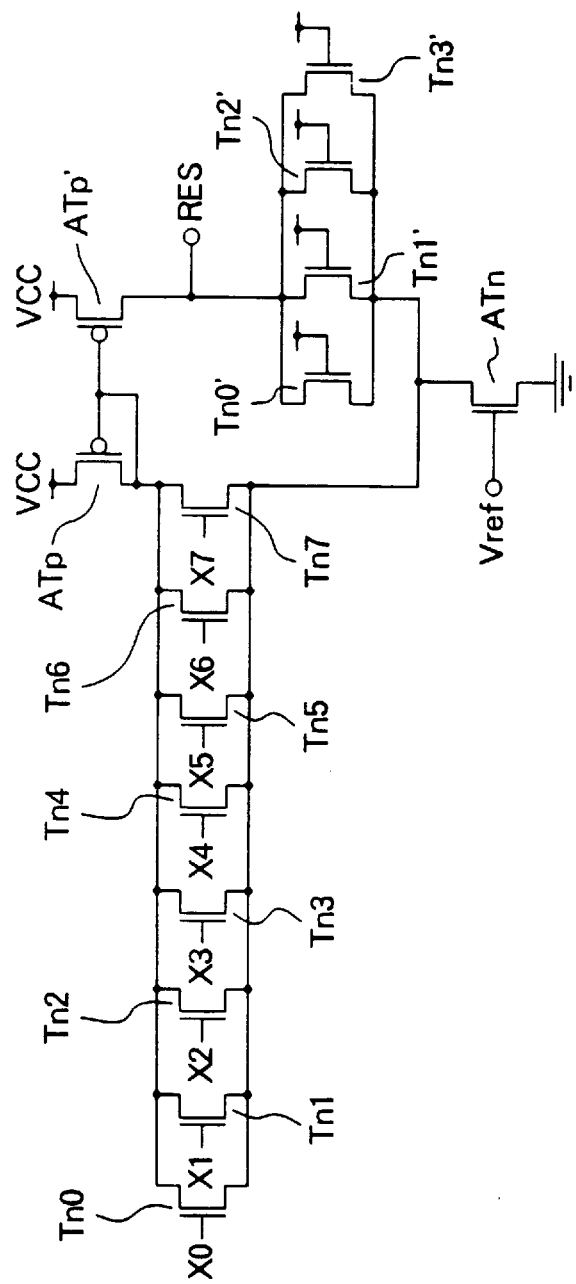
FIG. 7 is a block diagram of a judging circuit according to a fifth embodiment of this invention.

Turning to FIG. 7, a judging circuit according to a fifth embodiment of this invention is similar to the judging circuit of FIG. 3 except for the following. The judging circuit has first, second, and third amplifier MISFETs ATp, ATp', and ATn which constitute a differential amplifier (operational amplifier). A combination of the first through the eighth (N-th) primary MISFETs Tn0 to Tn7 and another combination of the first through the fourth (M-th) secondary MISFETs Tn0' to Tn3' are operable as input transistors of the differential amplifier which is constituted by the first, the second, and the third amplifier MISFETs ATp, Atp', and ATn. With this structure, it is not necessary to use the primary and the secondary resistor elements R and R' (FIG. 3).

More specifically, each of the first and second amplifier MISFETs ATp and ATp' is a p-channel MISFET. The third amplifier MISFET ATn is an n-channel MISFET.

Sources of the first and the second-amplifier MISFETs ATp and ATp' are supplied with the power-supply voltage VCC in common. Gates of the first and the second amplifier MISFETs ATp and ATp' are connected to a drain of the first amplifier MISFET ATp in common.

A source of the third amplifier MISFET ATn is connected to the ground. A gate of the third amplifier MISTET ATn is supplied with a gate voltage Vref so that the third amplifier MISFET ATn is constantly kept in an on-state.

The sources of the first through the eighth (N-th) primary MISFETs Tn0 to Tn7 are connected to a drain of the third amplifier MISFET ATn in common. The drains of the first through the eighth (N-th) primary MISFETs Tn0 to Tn7 are connected to the drain of the first amplifier MISFET ATp in common.

The sources of the first through the fourth (M-th) secondary MISFETs Tn0' to Tn3' are connected to the drain of the third amplifier MISFET in common. The drains of the first through the fourth (M-th) secondary MISFETs Tn0' to Tn3' are connected to a drain of the second amplifier MISFET ATp' in common.

The drain of the second amplifier MISFET ATp' is connected to the judgment result output terminal.

The judging circuit of FIG.7 is similar in operation to the judging circuit of FIG. 3.

The additional MISFET Tna of FIG. 5 may be added to the judging circuit illustrated in FIG. 7. In this case, the drain of the additional MISFET Tna is connected to the drain of the second amplifier MISFET ATp'.

Figure 8:
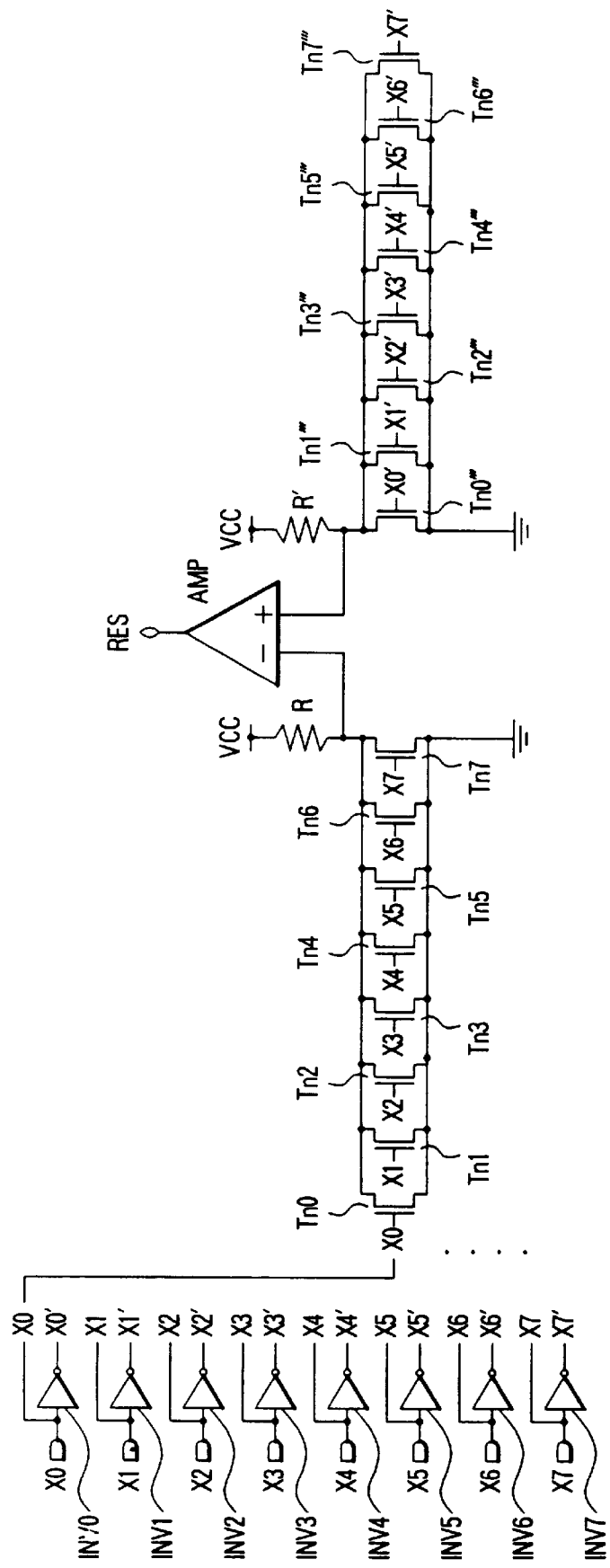
FIG. 8 is a block diagram of a judging circuit according to a sixth embodiment of this invention.

Turning to FIG. 8, a judging circuit according to a sixth embodiment of this invention comprises similar parts designated by like reference-numerals or signs. The judging circuit judges whether or not the number of the high-level bits among the first through the eighth (N-th) bits X0 to X7 of the digital input signal is a majority of the first through the N-th bits X0 to X7. In the illustrated example, the majority is any one of five, six, seven, and eight. When the number of the high-level bits is the majority, the judging circuit produces a judgment result having a high level "1" and delivers the judgment result having a high level "1" to the judgment result output terminal RES.

The judging circuit has first through eighth (N-th) inverters INV0 to INV7 which inverts the first through the N-th bits of the digital input signal into first through eighth (N-th) inverted bits X0' to X7'. The judging circuit further has first through eighth (N-th) secondary MISFETs Tn0''' to Tn7''', each of which is an n-channel MISFET and has a source, a drain, and a gate.

The sources of the first through the eighth (N-th) secondary MISFETs Tn0''' to Tn7''' are connected to the ground in common. The drains of the first through the eighth (N-th) secondary MISFETs Tn0''' to Tn7''' are connected to one end of the secondary resistor element R' in common. The gates of the first through the eighth (N-th) secondary MISFETs Tn0''' to Tn7''' are supplied with the first through the eighth (N-th) inverted-bits X0' to X7', respectively. The first through the eighth (N-th) secondary MISFETs Tn0''' to Tn7''' having on-currents, respectively, which are equal to one another and equal to the on-currents of the first through the eighth (N-th) primary MISFETs Tn0 to Tn7. The first through the eighth (N-th) primary MISFETs Tn0 to Tn7 are supplied with the first through the eighth (N-th) bits X0 to X7, respectively.

With this structure, those secondary MISFETs of the first through the eighth (N-th) secondary MISFETs Tn0''' to Tn7''' which correspond to the low-level bits of the digital input signal, are put in the on-state or the conductive state. On the other hand, those primary MISFETs of the first through the eighth (N-th) primary MISFETs Tn0 to Tn7 which correspond to the lower-level bits of the digital input signal, are put in the on-state. A difference between a total on-current of the secondary MISFETs put in the on-state and another total on-current of the primary MISFETs put in the on-state is judged in the primary and the secondary resistor elements R and R' and the differential amplifier AMP to be produced as the judgment result.

Figure 9:
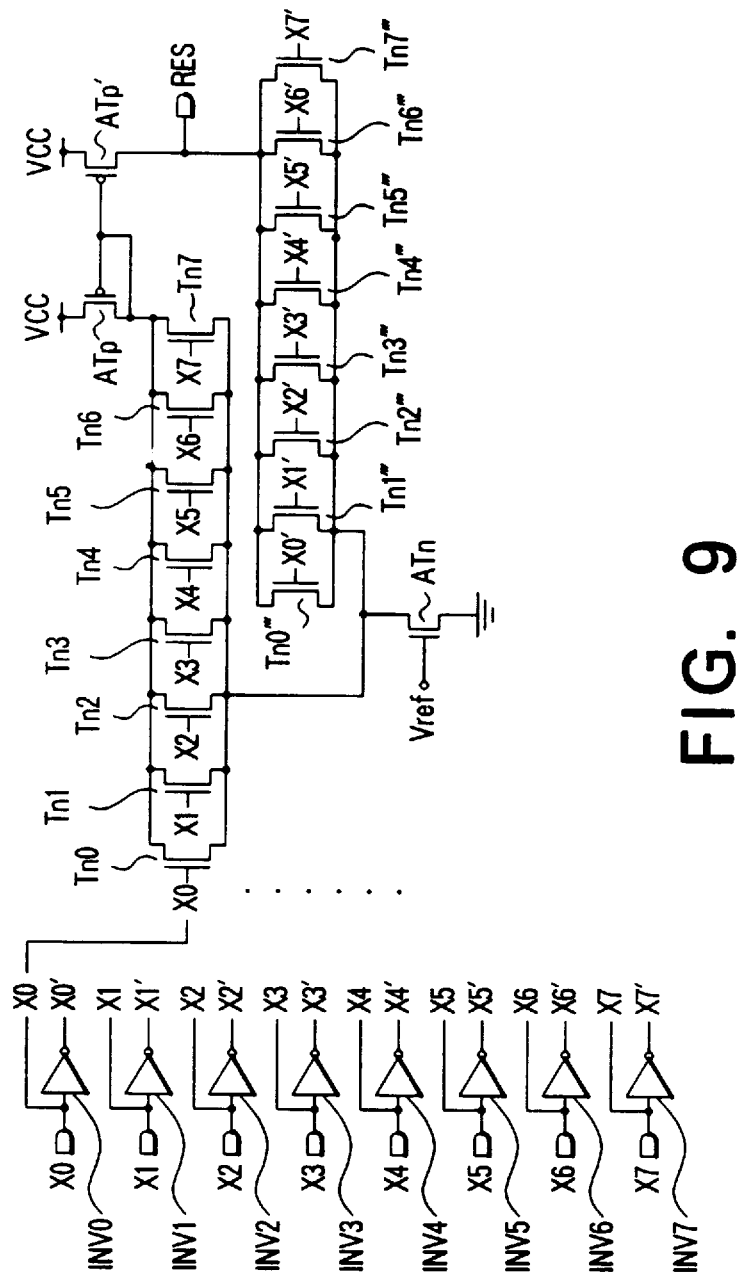
FIG. 9 is a block diagram of a judging circuit according to a seventh embodiment of this invention.

Turning to FIG. 9, a judging circuit according to a seventh embodiment of this invention comprises similar parts designated by like reference numerals or signs and is similar to the judging circuit of FIG. 8 except for the following. Like the judging circuit of FIG. 7, the judging circuit of FIG. 9 has also has the first, the second, and the third amplifier MISFETs ATp, ATp', and ATn which constitute a differential amplifier. A combination of the first through the eighth (N-th) primary MISFETs Tn0 to Tn7 and another combination of the first through the eighth (N-th) secondary MISFETs Tn0''' to Tn7''' serves as input transistors of the differential amplifier constituted by the first, the second, and the third amplifier MISFETs ATp, ATp', and ATn. It is not necessary to use the primary and the secondary resistor elements R and R' (FIG. 8). The sources of the first through the eighth (N-th) secondary MISFETs Tn0''' to Tn7''' are connected to the drain of the third amplifier MISFET ATn in common. The drains of the first through the eighth (N-th) secondary MISFETs Tn0''' to Tn7''' are connected to the drain of the second amplifier MISFET ATp in common.

Figure 10:
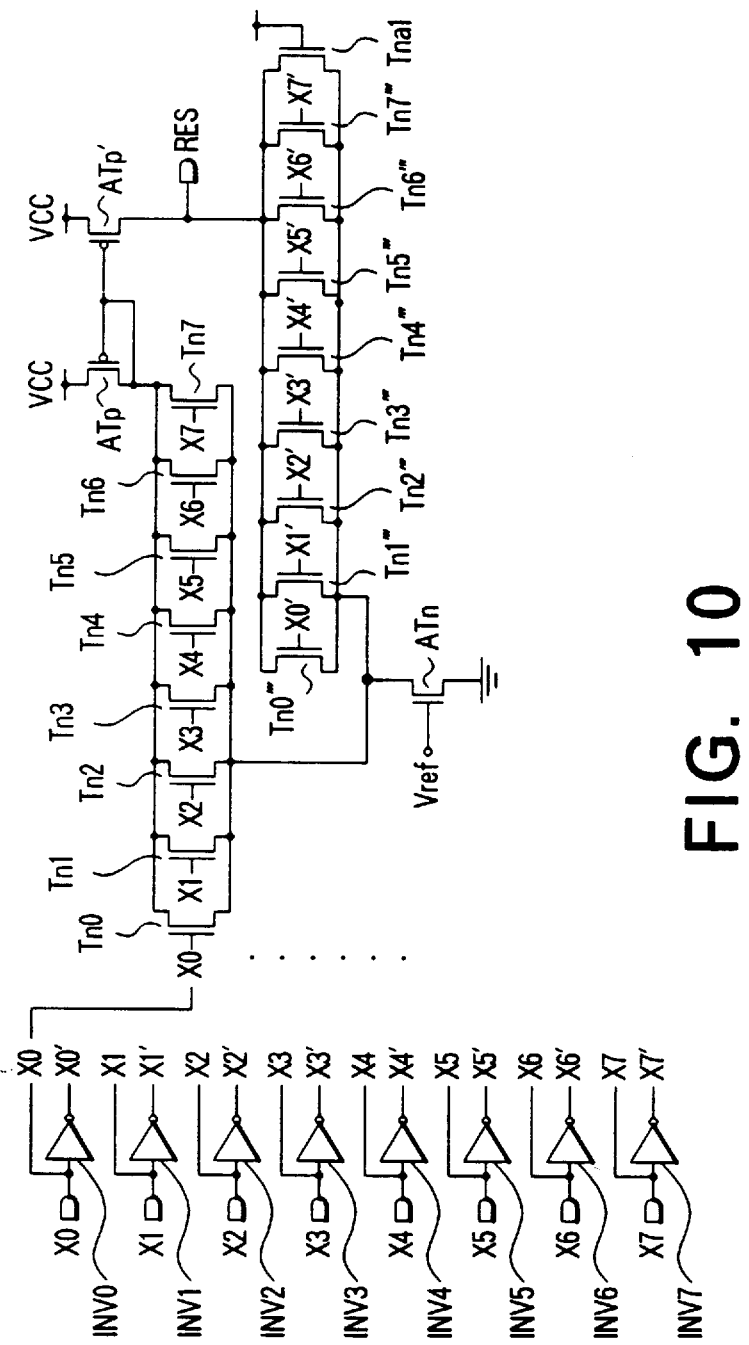
FIG. 10 is a block diagram of a judging circuit according to an eighth embodiment of this invention.

Turning to FIG. 10, a judging circuit according to a eighth embodiment of this invention is similar to the judging circuit of FIG. 9 except that the judging circuit of FIG. 10 has an additional MISFET Tna1 which is an n-channel MISFET and has a source, a drain, and a gate.

The source of the additional MISFET Tna1 is connected to the ground. The drain of the additional MISFET Tna1 is connected to the drain of the second amplifier MISFET ATp'. The gate of the additional MISFET Tna1 is supplied with another gate voltage so that the additional MISFET Tna1 is constantly kept in an on-state. The additional MISFET Tna1 has an on-current equal to the on-current of each of the first through the eighth (N-th) secondary MISFETs Tn0''' to Tn7'''.

When the number of the high level bits among the first through the eighth bits X0 to X7 is equal to four, the judging circuit of FIG. 9 may produce a judgment result signal having the intermediate level and to deliver the judgment result signal having the intermediate level to the judgment result output terminal RES like in the judging circuit of FIG. 3. This problem occurs in a case where N is an even number. In order to prevent this problem, the additional MISFET Tna1, equal in transistor size to each of the first through the eighth (N-th) secondary MISFETs Tn0''' to Tn7''', is added to the judging circuit in FIG. 10. As a result, the judging circuit of FIG. 10 produces a judgment result signal having the low level "0" on the judgment result output terminal RES when the number of the high level bits among the first through the eighth bits X0 to X7 is equal to four.

The additional MISFET Tna1 may be added to the judging circuit in FIG. 8. In this case, the source of the additional MISFET Tna1 is connected to the ground. The drain of the additional MISFET Tna1 is connected to the above-mentioned one end of the secondary resistor element R'.

Figure 11:
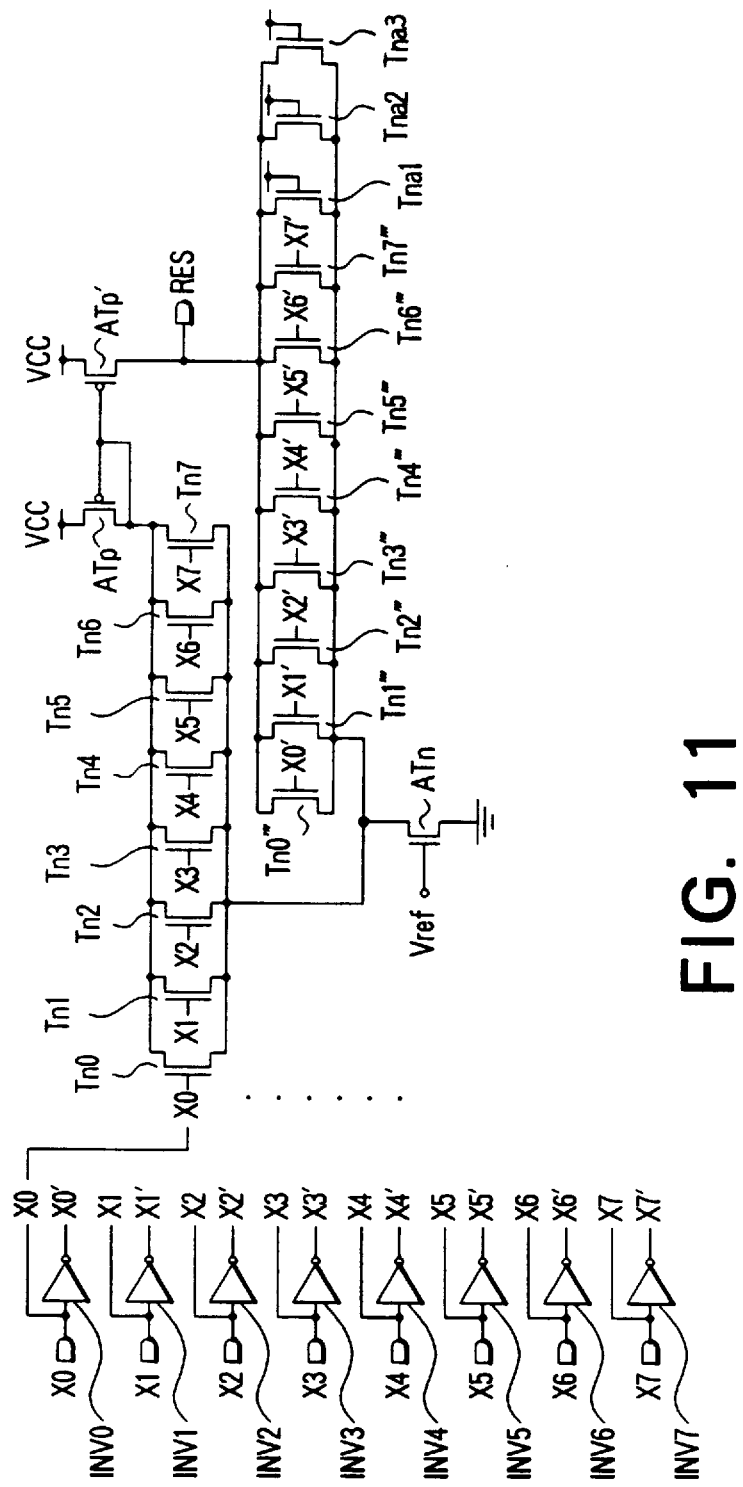
FIG. 11 is a block diagram of a judging circuit according to a ninth embodiment of this invention.

Turning to FIG. 11, a judging circuit according to a ninth embodiment of this invention is similar to the judging circuit of FIG. 10 except that the judging circuit of FIG. 11 has additional MISFETs Tna2 and Tna3 which is an n-channel MISFET. Each of the sources of the additional MISFETs Tna2 and Tna3 is connected to the ground. Each of the drains of the additional MISFETs Tna2 and Tna3 is connected to the drain of the second amplifier MISFET ATp'. Each of the gates of the additional MISFETs Tna2 and Tna3 is supplied with the gate voltage so that each of the additional MISFETs Tna2 and Tna3 is constantly kept in an on-state. Each of the additional MISFETs Tna2 and Tna3 has an on-current equal to the on-current of each of the first through the eighth (N-th) secondary MISFETs Tn0''' to Tn7'''.

In this case, the judging circuit of FIG. 11 judges whether or not the number of the high-level bits among the first through the eighth (N-th) bits X0 to X7 of the digital input signal is greater than six. When the number of the high-level bits among the first through the eighth (N-th) bits X0 to X7 of the digital input signal is greater than six, the judging circuit produces a judgment result having a high level "1" on the judgment result output terminal RES.

Figures 12, 13:
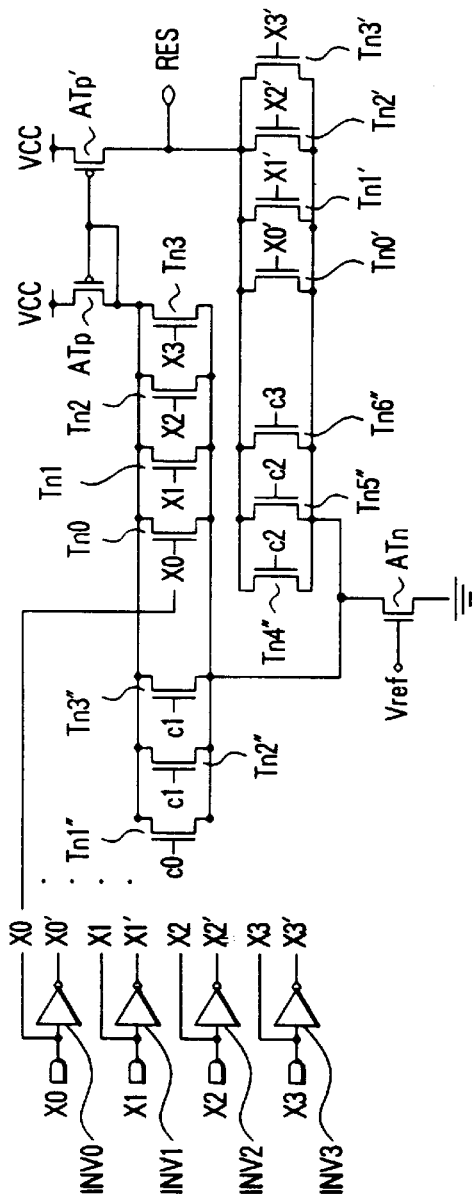
FIG. 12 is a block diagram of a judging circuit according to a tenth embodiment of this invention.
FIG. 13 is a view for use in describing operation of the judging circuit illustrated in FIG. 12.

Turning to FIG. 12, a judging circuit according to a tenth embodiment of this invention comprises similar parts designated by like reference numerals or signs. The judging circuit carries out various judgment by supplying control signal c0 to c3 to the n-channel MISFETs Tn1'' to Tn6'' in the manner illustrated in FIG. 13. For examples by supplying the control signal c0 of a high level "1" to the gate of the MISFET Tn1'' and by supplying the control signals c1, c2, and c3 of a low level "0" to the gates of the MISFETs Tn2'' to Tn6'', the judging circuit carries out the judgment (#"1">1) whether or not the number of the high-level bits among the first through the fourth bits X0 to X3 of the digital input signal is greater than one.

While this invention has thus far been described in conjunction with some preferred embodiments thereof, it will readily be possible for those skilled in the art to put this invention into practice in various other manners. For example, a p-channel MISFET may be used instead of the n-channel MISFET which is used as each of the primary and the secondary MISFETs and the third amplifier MISFET in FIGS. 3–12. In this case, an n-channel MISFET is used instead of the p-channel MISFET which is used as each of the first and the second amplifier MISFETs in FIGS. 3–12. In each of these judging circuits, it is necessary to substitute the power-supply voltage VCC and the ground for each other. Each of these judging circuits produces a low level "0" as the judgment result either when the number of the high-level bits is greater than the predetermined number M or when the number of the high-level bits is the majority.

Such judging circuits are equivalent in operation to those illustrated in FIGS. 3–12.

What is claimed is:

1. A judging circuit which has a judgment result output terminal and which is supplied with a digital input signal comprising first through N-th bits (N being an integer not smaller than two), each being any one of a high-level bit having a high level and a low-level bit having a low level, said judging circuit judging whether or not the number of the high-level bits among said first through said N-th bits is greater than a predetermined number M (M being an integer satisfying $1 \leq M < N$), said judging circuit thereby producing, when said number exceeds said predetermined number M, a judgment result which represents that said number exceeds said predetermined number M and which is delivered to said judgment result output terminal, said judging circuit comprising:

a differential amplifier having an inverted input terminal, a non-inverted input terminal, and an amplifier output terminal;

first through N-th primary MISFETs (metal insulator semiconductor field effect transistors), each having a source, a drain, and a gate;

first through M-th secondary MISFETs, each having a source, a drain, and a gate;

a primary resistor element; and a secondary resistor element having a resistance equal to that of said primary resistor element;

the sources of said first through said N-th primary MISFETs being connected to the ground in common, the drains of said first through said N-th primary MISFETs being connected to one end of said primary resistor element in common, the other end of said primary resistor element being supplied with a power-supply voltage, the gates of said first through said N-th primary MISFETs being supplied with said first through said N-th bits, respectively, said first through said N-th primary MISFETs having on-currents, respectively, which are equal to one another, the inverted input terminal of said differential amplifier being connected to said one end of the primary resistor element;

the sources of said first through said M-th secondary MISFETs being connected to the ground in common, the drains of said first through said M-th secondary MISFETs being connected to one end of said secondary resistor element in common, the other end of said secondary resistor element being supplied with said power-supply voltage, the gates of said first through said M-th secondary MISFETs being supplied with a gate voltage in common so that said first through said M-th secondary MISFETs are constantly kept in an on-state, said first through said M-th secondary MISFETs having on-currents, respectively, which are equal to one another and equal to the on-currents of said first through said N-th primary MISFETs, the non-inverted input terminal of said differential amplifier being connected to said one end of the secondary resistor element;

said amplifier output terminal being connected to said judgment result output terminal.

2. A judging circuit as claimed in claim 1, further comprising an additional MISFET having a source, a drain, and a gate;

the source of said additional MISFET being connected to the ground, the drain of said additional MISFET being connected to said one end of the secondary resistor element, the gate of said additional MISFET being supplied with another gate voltage so that said additional MISFET is constantly kept in an on-state, said additional MISFET having an on-current smaller than the on-current of each of said first through said M-th secondary MISFETs.

3. A judging circuit which has a judgment result output terminal and which is supplied with a digital input signal comprising first through N-th bits (N being an integer not smaller than two), each being any one of a high-level bit having a high level and a low-level bit having a low level, said judging circuit judging whether or not the number of the high-level bits among said first through said N-th bits is greater than a predetermined number M (M being an integer satisfying $1 \leq M < N$), said judging circuit thereby producing, when said number exceeds said predetermined number M, a judgment result which represents that said number exceeds said predetermined number M and which is delivered to said judgment result output terminal, said judging circuit comprising:

a differential amplifier having an inverted input terminal, a non-inverted input terminal, and an amplifier output terminal;

first through N-th primary MISFETs, each having a source, a drain, and a gate;

first through N-th secondary MISFETs, each having a source, a drain, and a gate;

a primary resistor element; and a secondary resistor element having a resistance equal to that of said primary resistor element;

the sources of said first through said N-th primary MISFETs being connected to the ground in common, the drains of said first through said N-th primary MISFETs being connected to one end of said primary resistor element in common, the other end of said primary resistor element being supplied with a power-supply voltage, the gates of said first through said N-th primary MISFETs being supplied with said first through said N-th bits, respectively, said first through said N-th primary MISFETs having on-currents, respectively, which are equal to one another, the inverted input terminal of said differential amplifier being connected to said one end of the primary resistor element;

the sources of said first through said N-th secondary MISFETs being connected to the ground in common, the drains of said first through said N-th secondary MISFETs being connected to one end of said secondary resistor element in common, the other end of said secondary resistor element being supplied with said power-supply voltage, said first through said N-th secondary MISFETs having on-currents, respectively, which are equal to one another and equal to the on-currents of said first through said N-th primary MISFETs, the non-inverted input terminal of said differential amplifier being connected to said one end of the secondary resistor element;

the gates of a preselected number of secondary MISFETs of said first through said N-th secondary MISFETs being supplied with a gate voltage in common so that said preselected number of secondary MISFETs are constantly kept in an on-state, said preselected number being equal to said predetermined number M;

said amplifier output terminal being connected to said judgment result output terminal.

4. A judging circuit which has a judgment result output terminal and which is supplied with a digital input signal comprising first through N-th bits (N being an integer not smaller than two), each being any one of a high-level bit having a high level and a low-level bit having a low level, said judging circuit judging whether or not the number of the high-level bits among said first through said N-th bits is greater than a predetermined number M (M being an integer satisfying 1≦M<N), said judging circuit thereby producing, when said number exceeds said predetermined number X, a judgment result which represents that said number exceeds said predetermined number M and which is delivered to said judgment result output terminal, said judging circuit comprising:

first, second, and third amplifier MISFETs, each having a source, a drain, and a gate;

first through N-th primary MISFETs, each having a source, a drain, and a gate;

first through M-th secondary MISFETs, each having a source, a drain, and a gate;

each of said third amplifier MISFET, said first through said N-th primary MISFETs, and said first through said M-th secondary MISFETs being an MISFET of a first conductivity-channel type, each of said first and said second amplifier MISFETs being another MISFET of a second conductivity-channel type which is different from said first conductivity-channel type;

the sources of said first and said second amplifier MISFETs being supplied with a power-supply voltage in common, the gates of said first and said second amplifier MISFETs being connected to the drain of said first amplifier MISFET in common;

the source of said third amplifier MISFET being connected to the ground, the gate of said third amplifier MISFET being supplied with a gate voltage so that said third amplifier MISFET is constantly kept in an on-state;

the sources of said first through said N-th primary MISFETs being connected to the drain of said third amplifier MISFET in common, the drains of said first through said N-th primary MISFETs being connected to the drain of said first amplifier MISFET in common, the gates of said first through said N-th primary MISFETs being supplied with said first through said N-th bits, respectively, said first through said N-th primary MISFETs having on-currents, respectively, which are equal to one another;

the sources of said first through said M-th secondary MISFETs being connected to the drain of said third amplifier MISFET in common, the drains of said first through said M-th secondary MISFETs being connected to the drain of said second amplifier MISFET in common, the gates of said first through said M-th secondary MISFETs being supplied with another gate voltage so that said first through said M-th secondary MISFETs are constantly kept in an on-state, said first through said M-th secondary MISFETs having on-currents, respectively, which are equal to one another and equal to the on-currents of said first through said N-th primary MISFETS;

the drain of said second amplifier MISFET being connected to said judgment result output terminal.

5. A judging circuit as claimed in claim 4, further comprising an additional MISFET having a source, a drain, and a gate;

the source of said additional MISFET being connected to the ground, the drain of said additional MISFET being connected to the drain of said second amplifier MISFET, the gate of said additional MISFET being supplied with still another gate voltage so that additional MISFET is constantly kept in an on-state, said additional MISFET having an on-current smaller than the on-current of each of said first through said M-th secondary MISFETs.

6. A judging circuit which has a judgment result output terminal and which is supplied with a digital input signal comprising first through N-th bits (N being an even integer not smaller than two), each being any one of a high-level bit having a high level and a low-level bit having a low level, said judging circuit judging whether or not the number of the high-level bits among said first through said N-th bits is a majority of said first through said N-th bits, said judging circuit thereby producing, when said number is said majority, a judgment result which represents that said number is said majority and which is delivered to said judgment result output terminal, said judging circuit comprising:

first through N-th inverter for inverting said first through said N-th bits into first through N-th inverted bits;

a differential amplifier having an inverted input terminal, a non-inverted input terminal, and an amplifier output terminal;

first through N-th primary MISFETS, each having a source, a drain, and a gate;

first through N-th secondary MISFETs, each having a source, a drain, and a gate;

a primary resistor element;

a secondary resistor element having a resistance equal to that of said primary resistor element;

the sources of said first through said N-th primary MISFETs being connected to the ground in common, the drains of said first through said N-th primary MISFETs being connected to one end of said primary resistor element in common, the other end of said primary resistor element being supplied with a power-supply voltage, the gates of said first through said N-th primary MISFETs being supplied with said first through said N-th bits, respectively, said first through said N-th primary MISFETs having on-currents, respectively, which are equal to one another, the inverted input terminal of said differential amplifier being connected to said one end of the primary resistor element;

the sources of said first through said N-th secondary MISFETs being connected to the ground in common, the drains of said first through said N-th secondary MISFETs being connected to one end of said secondary resistor element in common, the other end of said secondary resistor element being supplied with said power-supply voltage, the gates of said first through said N-th secondary MISFETs being supplied with said first through said N-th inverted bits, respectively, said first through said N-th secondary MISFETs having on-currents, respectively, which are equal to one another and equal to the on-currents of said first through said N-th primary MISFETs, the non-inverted input terminal of said differential amplifier being connected to said one end of the secondary resistor element;

said amplifier output terminal being connected to said judgment result output terminal; and an additional MISFET having a source, a drain, and a gate;

the source of said additional MISFET being connected to the ground, the drain of said additional MISFET being connected to said one end of the secondary resistor element, the gate of said additional MISFET being supplied with a gate voltage so that said additional MISFET is constantly kept in an on-state, said additional MISFET having an on-current equal to the on-current of each of said first thorough said N-th secondary MISFETs.

7. A judging circuit which has a judgment result output terminal and which is supplied with a digital input signal comprising first through N-th bits (N being an integer not smaller than two), each being any one of a high-level bit having a high level and a low-level bit having a low level, said judging circuit judging whether or not the number of the high-level bits among said first through said N-th bits is a majority of said first through said N-th bits, said judging circuit thereby producing, when said number is said majority, a judgment result which represents that said number is said majority and which is delivered to said judgment result output terminal, said judging circuit comprising:

first through N-th inverters for inverting said first through said N-th bits into first-through N-th inverted bits;

first, second, and third amplifier MISFETs, each having a source, a drain, and a gate;

first through N-th primary MISFETs, each having a source, a drain, and a gate;

first through N-th secondary MISFETs, each having a source, a drain, and a gate;

each of said third amplifier MISFET, said first through said N-th primary MISFETS, and said first through said N-th secondary MISFETs being an MISFET of a first conductivity-channel type, each of said first and said second amplifier MISFETs being another MISFET of a second conductivity-channel type which is different from said first conductivity-channel type;

the sources of said first and said second amplifier MISFETs being supplied with a power-supply voltage in common, the gates of said first and said second amplifier MISFETs being connected to the drain of said first amplifier MISFET in common;

the source of said third amplifier MISFET being connected to the ground, the gate of said third amplifier MISFET being supplied with a gate voltage so that said third amplifier MISFET is constantly kept in an on-state;

the sources of said first through said N-th primary MISFETs being connected to the drain of said third amplifier MISFET in common, the drains of said first through said N-th primary MISFETs being connected to the drain of said first amplifier MISFET in common, the gates of said first through said N-th primary MISFETs being supplied with said first through said N-th bits, respectively, said first through said N-th primary MISFETs having on-currents, respectively, which are equal to one another;

the sources of said first through said N-th secondary MISFETs being connected to the drain of said third amplifier MISFET in common, the drains of said first through said N-th secondary MISFETs being connected to the drain of said second amplifier MISFET in common, the gates of said first through said N-th secondary MISFETs being supplied with said first through said N-th inverted bits, respectively, said first through said N-th secondary MISFETs having on-currents, respectively, which are equal to one another and equal to the on-currents of said first through said N-th primary MISFETs;

the drain of said second amplifier MISFET being connected to said judgment result output terminal.

8. A judging circuit as claimed in claim 7, N being an even number, wherein:

said judging circuit further comprises an additional MISFET having a source, a drain, and a gate;

the source of said additional MISFET being connected to the ground, the drain of said additional MISFET being connected to the drain of said second amplifier MISFET, the gate of said additional MISFET being supplied with another gate voltage so that said additional MISFET is constantly kept in an on-state, said additional MISFET having an on-current equal to the on-current of each of said first through said N-th secondary MISFETs.

9. A judging circuit comprising:

a differential amplifier having an inverted input terminal, a non-inverted input terminal, and an amplifier output terminal;

a primary load element coupled at one end to a first power supply and at another end to said inverted input terminal of said differential amplifier;

a secondary load element having a resistance equal to that of said primary load element and coupled at one end to said first power supply and at another end to said non-inverted input terminal of said differential amplifier;

a plurality of N primary FETs, connected in parallel at their respective source and drain and coupled at said drains to said inverting terminal of said differential amplifier and at said sources to a second power supply, and each of said plurality of N primary FETs having a gate supplied with one bit of a digital input signal comprising N bits; and a plurality of M secondary FETs, connected in parallel at their respective source and drain and coupled at said drains to said non-inverting terminal of said differential amplifier and at said sources to said second power supply, and each of said plurality of M secondary FETs having their respective gates supplied with a common gate voltage so that said M secondary FETs are constantly kept in an on-state.

10. A judging circuit as claimed in claim 9, further comprising:

an additional FET being smaller in size than said primary FETs and said secondary FETs, connected in parallel at its drain and source to said plurality of M secondary FETs, and having its gate being supplied with another gate voltage so that said additional FET is constantly kept in an on-state, thereby said additional FET having an on-current smaller than the on-current of each of said primary FETS and said secondary FETs so that no intermediate level, lower than a high level (1) and higher than a low level (0), is output from said amplifier output terminal when said digital input signal comprising N bits has a number of high level bits equal to M.

11. A judging circuit as claimed in claim 9, further comprising:

an additional FET being smaller in size than said primary FETs and said secondary FETs, connected in parallel at its drain and source to said plurality of N primary FETS, and having its gate being supplied with another gate voltage so that said additional FET is constantly kept in an on-state, thereby said additional FET having an on-current smaller than the on-current of each of said primary FETs and said secondary FETs so that no intermediate level, lower than a high level (1) and higher than a low level (0), is output from said amplifier output terminal when said digital input signal comprising N bits has a number of high level bits equal to M.

12. A judging circuit as claimed in claim 10, wherein N=8, M=4, and said judging circuit judging whether or not the number of the high-level bits among said N (8) bits is greater than M (4), said judging circuit thereby producing at said differential amplifier output terminal, when said number exceeds M (4), a judgement result which represents that said number exceeds M (4), so as to judge whether a majority of said digital input signal N (8) bits has a number of high level bits greater than M (4).

13. A judging circuit as claimed in claim 10, wherein said N primary FETs having on-currents, respectively, which are equal to one another, and said M secondary FETs having on-currents, respectively, which are equal to one another and equal to the on-currents of said N primary FETs.

14. A judging circuit comprising:
   first and second amplifier FETs of a first conductivity-channel type, connected at their respective first source/drain terminal to a first power supply voltage, and connected at their respective gates to each other and a second source/drain terminal of said first amplifier FET;
   a third amplifier FET of a second conductivity-channel type, having a first source/drain terminal, a second source/drain terminal, and a gate, said second source/drain terminal of said third amplifier FET connected to a second power supply;
   a plurality of N primary FETs of a second conductivity-channel type, each connected in parallel at their respective first source/drain terminals and second source/drain terminals so as to be coupled in parallel between said second source/drain terminal of said first amplifier FET and said first source/drain terminal of said third amplifier FET, and each of said plurality of N primary FETs having a gate supplied with one bit of a digital input signal comprising N bits; and
   a plurality of M secondary FETs of a second conductivity-channel type, each connected in parallel at their respective first source/drain terminals and second source/drain terminals so as to be coupled in parallel between a second source/drain terminal of said second amplifier FET and said first source/drain terminal of said third amplifier FET; and
   an amplifier output terminal connected to said second source/drain terminal of said second amplifier FET.

15. A judging circuit as claimed in claim 14, further comprising:
   an additional FET being smaller in size than said primary FETs and said secondary FETs, connected in parallel at a first source/drain and a second source/drain to said plurality of M secondary FETs, and having its gate being supplied with another supply voltage so that said additional FET is constantly kept in an on-state, thereby said additional FET having an on-current smaller than the on-current of each of said primary FETs and said secondary FETs so that no intermediate level, lower than a high level (1) and higher than a low level (0), is output from said amplifier output terminal when said digital input signal comprising N bits has a number of high level bits equal to M.

16. A judging circuit as claimed in claim 14, further comprising:
   an additional FET being smaller in size than said primary FETs and said secondary FETS, connected in parallel at a first source/drain and a second source/drain to said plurality of N primary FETs, and having its gate being supplied with another supply voltage so that said additional FET is constantly kept in an on-state, thereby said additional FET having an on-current smaller than the on-current of each of said primary FETs and said secondary FETs so that no intermediate level, lower than a high level (1) and higher than a low level (0), is output from said amplifier output terminal when said digital input signal comprising N bits has a number of high level bits equal to M.

17. A judging circuit as claimed in claim 14, further comprising gates of said plurality of M secondary FETs coupled to said first power supply voltage, each of said plurality of M secondary FETs having their respective gates supplied with a common gate voltage so that said M secondary FETs are constantly kept in an on-state.

18. A judging circuit as claimed in claim 14, further comprising:
   N inverters, one of each connected to a gate of said plurality of M secondary FETs, respectively, for inverting selected bits of said digital input signal comprising N bits, said gates of said M secondary FETs being supplied with one each of said selected N inverted bits, respectively, and said gates of said N primary FETs being supplied with said N bits, respectively.

19. A judging circuit as claimed in claim 14, further comprising:
   a plurality of first additional FETs of a second conductivity-channel type, each connected in parallel at their respective first source/drain terminals and second source/drain terminals so as to be coupled in parallel between said second source/drain terminal of said first amplifier FET and said first source/drain terminal of said third amplifier FET and thus in parallel with said plurality of N primary FETs, each of said plurality of first additional FETs having a gate supplied with one of a plurality of control signals; and
   a plurality of second additional FETs of a second conductivity-channel type, each connected in parallel at their respective first source/drain terminals and second source/drain terminals so as to be coupled in parallel between a second source/drain terminal of said second-amplifier FET and said first source/drain terminal of said third amplifier FET and thus in parallel with said plurality of M secondary FETs, each of said plurality of second additional FETs having a gate supplied with others of said plurality of control signals, to thereby selectively determine the maximum number of high level inputs of said N bits of said digital input signal to be determined as a threshold of said judging circuit.

* * * * *